(12) United States Patent
Udrea et al.

(10) Patent No.: US 7,531,875 B2
(45) Date of Patent: May 12, 2009

(54) LATERAL SOI SEMICONDUCTOR DEVICE

(75) Inventors: Florin Udrea, Cambridge (GB); David Garner, Cambridge (GB)

(73) Assignee: Cambridge Semiconductor Limited, Cambridge, Cambridgeshire (GB)

( * ) Notice: Subject to any disclaimer, the term of this patent is extended or adjusted under 35 U.S.C. 154(b) by 0 days.

(21) Appl. No.: 10/556,927

(22) PCT Filed: May 13, 2003

(86) PCT No.: PCT/GB03/02025

§ 371 (c)(1), (2), (4) Date: Jan. 22, 2007

(87) PCT Pub. No.: WO2004/102672

PCT Pub. Date: Nov. 25, 2004

(65) Prior Publication Data

US 2007/0120187 A1 May 31, 2007

(51) Int. Cl.
*H01L 29/94* (2006.01)

(52) U.S. Cl. ...................... 257/343; 257/345

(58) Field of Classification Search ......... 257/334–343, 257/347, 404, E29.006–E29.014
See application file for complete search history.

(56) References Cited

U.S. PATENT DOCUMENTS

| | | | | | |
|---|---|---|---|---|---|
| 5,438,215 | A | * | 8/1995 | Tihanyi | 257/401 |
| 5,473,180 | A | * | 12/1995 | Ludikhuize | 257/336 |
| 6,023,090 | A | * | 2/2000 | Letavic et al. | 257/347 |
| 6,777,746 | B2 | * | 8/2004 | Kitagawa et al. | 257/335 |
| 6,828,605 | B2 | * | 12/2004 | Eisele et al. | 257/213 |
| 2003/0047792 | A1 | * | 3/2003 | Disney et al. | 257/488 |

* cited by examiner

*Primary Examiner*—Zandra Smith
*Assistant Examiner*—Paul E Patton

(57) ABSTRACT

This invention is generally concerned with semiconductor-on-insulator devices, particularly for high voltage applications. A lateral semiconductor-on-insulator device is described, comprising: a semiconductor substrate; an insulating layer on said semiconductor substrate; and a lateral semiconductor device on said insulator; said lateral semiconductor device having: a first region of a first conductivity type; a second region of a second conductivity type laterally spaced apart from said first region; and a drift region extending in a lateral direction between said first region and said second region; and wherein said drift region comprises at least one first zone and at least one second zone adjacent a said first zone, a said first zone having said second conductivity type, a said second zone being an insulating zone, a said first zone being tapered to narrow towards said first region.

25 Claims, 13 Drawing Sheets

LATERAL SOI SEMICONDUCTOR DEVICE

This invention is generally concerned with semiconductor-on-insulator devices, particularly for high voltage applications.

In the field of high voltage semiconductor devices there is generally a trade-off between blocking or breakdown voltage, device 'on' resistance and switching time. Silicon-on-insulator technology offers an improvement in such a combination of trade-offs and also facilitates integration of power structures with conventional CMOS components, for example combining a lateral double-diffused MOS transistor process with a CMOS process facilitating 'system-on-a-chip' integrated circuits. Early semiconductor-on-insulator technology employed silicon-on-sapphire but more recently silicon-on-insulator (SOR) technology has employed SIMOX (separation by implantation of oxygen) to create a thin, buried layer of silicon oxide within pure silicon.

Power semiconductor devices may be fabricated using either a vertical structure or a lateral structure, in this latter structure the current flowing horizontally or laterally through the device. Lateral power devices may be fabricated in either bulk silicon technology or using SOI technology, but SOI provides advantages because the active structure is electrically isolated from the substrate by the buried oxide (BOX) layer. This facilitates integration and allows faster switching since the oxide isolation reduces parasitic capacitance. However breakdown of the buried oxide layer can limit the maximum breakdown voltage of a device. Since the buried oxide also provides a degree of thermal isolation self-heating can also be a problem, although this can be alleviated by including a silicon window within the buried oxide.

One limitation in the breakdown voltage of a high voltage lateral device manufactured using SOI technology arises from the so-called RESURF (reduced surface field) effect, as explained further below with reference to FIG. 1.

As shown schematically in FIG. 1, a typical lateral high-voltage device 1 fabricated using SOI technology has a basic configuration of a p+ region 2 and an n+ region 3 at opposing ends separated by a central n drift region 4 of lower conductivity, all of which are formed in an SOI layer 5 which is formed on an oxide layer 6 which itself is formed on a silicon substrate 7. The p+ region 2 is shorted to the substrate 7 below the BOX (buried oxide layer) 6. In the blocking/off-state mode, a terminal (not shown) connecting the p+ region 2 and the substrate 7 is grounded and a high voltage reverse bias is applied to a terminal (not shown) connected to the n+ region 3. As the reverse bias is increased, a depletion layer develops across the p+/n junction 2/4. The bulk of the depletion layer forms within the central n region 4 so that a significant portion of the applied reverse bias is sustained inside the central n region 4. Simultaneously, due to a field effect action across the buried oxide 6, an inversion/accumulation layer forms directly beneath the buried oxide layer 6 in the p or n type substrate 7. This layer of highly mobile charge maintains an equipotential surface at ground potential beneath the buried oxide layer 6 and screens nearly all of the electric field from the bulk of the substrate 7 and behaves in effect as a field plate. The field plate effect causes a crowding of the potential lines in the area surrounding the n+ region 3 which, during the blocking state, is connected to the reverse bias. The electric field inside the depleted region of the central n region 4 is thus distorted and results in the formation of a second electric field peak near the n+ region 3 in addition to the original electric field peak occurring at the p+/n junction 2/4. This is the so-called 'RESURF' phenomenon observed in high voltage SOI devices. The field plate effect reduces the lateral field in the drift region enabling the device to sustain higher voltages without breakdown (or providing a reduced 'on' resistance through increased doping for the same breakdown voltage).

Within the silicon-on-insulator layer the mechanism of voltage breakdown is a process known as 'impact ionisation' in which exited valence electrons collide with adjacent atoms so dislodging their valence electrons in an avalanche breakdown. Initially higher breakdown voltages were achieved by using greater silicon thicknesses but more recently it has been found that breakdown voltage is increased by using a thin SOI layer (typically of thickness 0.5 μm to 1.5 μm over a 2 μm to 3 μm buried oxide layer), broadly because the number of atoms available for such a chain reaction, and also electron mobility, is reduced. This allows the SOI layer, and more particularly the drift region of a device (described later), to be more heavily doped thus decreasing the on-resistance. FIG. 2 shows, for several doping concentrations, how in silicon the critical electric field at the SOI/BOX interface increases as the thickness of the silicon is reduced. However where the SOI layer is thin then reverse bias (i.e. the breakdown voltage) is supported mainly by the buried oxide layer.

It is preferable that the horizontal component of the electric field at the SOI/BOX interface (interface 5/6 of the device of FIG. 1) is approximately constant rather than higher in some places than others. Where this is the case the voltage along the line AB in FIG. 1 increases linearly towards B and thus the vertical component of the electric field at the SOI/BOX interface also increases substantially linearly along AB. Thus it is desirable to facilitate such a substantially linear increase in the vertical component of the electric field at the interface.

One way of achieving this is to employ a linear doping profile in the drift region as described, for example, in U.S. Pat Nos. 5,246,870, 5,648,671, 6,127,703, 5,969,387, 5,300, 448, and JP8316469, and ETRI Journal, Vol 21 No 3 September 99 22-28, "Characteristics of P-Channel SOI LDMOS Transistor with Tapered Field Oxides", J. Kim, SG-Kim, T M Roh, H S Park, $J_{13}$ G Koo, D Y Kim. Another approach is to use a tapered or stepped buried oxide layer. However a normally preferred approach uses graded doping or tapered 'superjunctions', as described in the Applicant's UK patent application GB2,308,056A. Superjunctions comprise alternating P-type and N-type columns within the drift region, carrying balanced charge. A depletion layer is formed at the P/N junction; when the device is on virtually the complete current flows in the N-type portion of the drift region; when the device is off this portion of the drift region is substantially fully depleted. Devices employing superjunctions and variants thereof are described in GB2,309,336A, U.S. Pat. Nos. 5,294,824, 5,438,215, and 6,023,090. Broadly speaking the use of a superjunction allows an increase in drift region doping without a corresponding decrease in the device's breakdown voltage. Other techniques relating to improved lateral SOI devices are described in U.S. Pat. Nos. 5,710,451, 5,378, 912, and 6,133,591.

In more detail, the Applicant's earlier application GB2, 308,056 describes a lateral semiconductor device, the device comprising a semiconductor layer on an insulating layer on a semiconductor substrate, the semiconductor layer having a region of a first conduction type an a region of a second conduction type with a drift region therebetween, the drift region being provided by a region of the first conduction type and a region of the second conduction type, a junction formed between the first and second conduction type drift regions lying at an acute angle to a line joining the first and second conduction type regions of the semiconductor layer with a major portion of the first conduction type drift region being towards the first conduction type region of the semiconductor layer and a major portion of the second conduction type drift region being towards the second conduction type region of the semiconductor layer, whereby when a reverse voltage bias is applied across the first and second conduction type regions of the semiconductor layer, the second conduction type drift region has an excess of charge relative to the first conduction type drift region which varies substantially linearly from the end of the drift region towards the first conduction type region of the semiconductor layer to the end of the drift region towards the second conduction type region of the semiconductor layer. The first and second conduction type drift regions may be substantially triangular or trapezoidal in shape parallel to the plane of the device. This helps provide a vertical electric field at the SOI/BOX interface which is proportional to the distance from the first conduction type region.

Another example of a known lateral thin-film silicon-on-insulator device is described in U.S. Pat. No. 6,023,090, from which FIGS. 3a to 3c and the following accompanying description are taken. Thus referring to FIG. 3a, a lateral thin-film SOI MOS transistor 20 includes a semiconductor substrate 22, a buried insulating layer 24, and a semiconductor surface layer 26 in which the device is fabricated. The MOS transistor includes a source region 28 of one conductivity type, a body region 30 of a second, opposite conductivity type, a lateral drift region 32 of the first conductivity type adjoining an edge 30A of the body region 30 and a drain region 34, also of the first conductivity type. The basic device structure is completed by a gate electrode 36, insulated from the underlying semiconductor surface layer 26 by an oxide insulation region 38. The MOS transistor structure may have various performance-enhancing features, such as a stepped oxide region 38A, 38B, an extended gate electrode structure forming a field plate portion 36A, and a thinned lateral drift region portion 32A and possibly even a further field plate on top of oxide region 32B, all as detailed in the aforementioned prior art, or other performance-enhancing features as desired. Alternatively, a lateral drift region of constant thickness may be employed. Additionally, the MOS transistor 20 may also include a surface contact region 40, in contact with source region 28, located in the body region 30 of the same conductivity type as the body region but more highly doped.

It will be understood that the simplified, representative devices shown in this and later figures depict particular device structures, but that wide variations in both device geometry and configuration can be used.

A simplified representative plan view of a device such as that shown in FIG. 3a is shown in FIG. 3b. In FIG. 3b, the lateral drift region 32 can be seen as extending between the right edge 30A of the body region 30 and the drain region 34, with a plurality of spaced-apart zones 32A of the second conductivity type extending horizontally in the lateral direction from the body region to the drain region. It will be understood that although only two such zones are shown in FIG. 3b, actual devices will in fact typically have a larger number of spaced-apart zones provided in the drift region. While a great variety of geometries and doping profiles are contemplated within the scope of the invention, both the lateral drift region 32 and the spaced-apart zones 32A should have a varying charge level in the lateral direction. In a typical embodiment, wherein the drift region is of n-type conductivity and the zones are of p-type conductivity, the charge level in the lateral drift region 32 will increase in a direction from the body region toward the drain region, while the charge level in the zones 32A will decrease in that direction.

The width of zones 32A and the drain region segments 32 between the zones 32A (in the direction of the line A-P in FIG. 3b may typically be in the range of 1 to 10 microns, with the varying charge level in these regions varying in the lateral direction by a factor of 5-10 times or greater from the body region edge 30A to the drain region 34 and with the charge level in the directions. Thus, for a typical device having a 50 micron lateral drift region length, the charge level in the drift region portions 32 may vary from about $1 \times 10^{12}$ at/cm$^2$ at the body region and of the device to about $7 \times 10^{12}$-$1 \times 10^{13}$ at/cm$^2$ at the drain end of the device, with a similar but opposite variation in the charge level of the spaced-level zones of the spaced-apart zones 32A.

In FIG. 3b, the spaced-apart zones 32A are tapered, as are the portions of the drift region 32 in between the spaced-apart zones 32A. In this embodiment, the lateral drift region and zones each have a constant doping level, rather than linear or other varying doping level, with the varying charge level feature being provided by the varying width of the drift region segments and the spaced-apart zones (in the direction of line B-B). A typical variation in width of the zones 32A and regions 32 in the ratio of about 5 or 10 to 1 from one side of the device to the other, with the precise degree of tapering being a function of the degree of charge level variation desired for a particular design.

Here we describe a modification to the aforementioned devices which, in embodiments, provides similar advantages but has a simplified device structure.

According to a first aspect of the present invention there is therefore provided a lateral semiconductor-on-insulator device comprising: a semiconductor substrate; an insulating layer on said semiconductor substrate; and a lateral semiconductor device on said insulator; said lateral semiconductor device having: a first region of a first conductivity type; a second region of a second conductivity type laterally spaced apart from said first region; and a drift region extending in a lateral direction between said first region and said second region; and wherein said drift region comprises at least one first zone and at least one second zone adjacent a said first zone, a said first zone having said second conductivity type, a said second zone being an insulating zone, a said first zone being tapered to narrow towards said first region.

According to a related aspect of the invention there is provided a lateral semiconductor-on-insulator device comprising: a semiconductor substrate; an insulating layer on said semiconductor substrate; and a lateral semiconductor device on said insulator; said lateral semiconductor device having: a first region of a first conductivity type; a second region of a second conductivity type laterally spaced apart from said first region; and a drift region extending in a lateral direction between said first and said second region; and wherein said drift region comprises interdigitated first and second zones, said first zones having said second conductivity type, a said second zone being an insulating zone, and wherein a ratio of a lateral area of said drift region occupied by a said first zone to a lateral area occupied by a said second zone is less towards said first region In preferred embodiments the semiconductor comprises silicon and the insulating zone silicon oxide, although other semiconductor materials such as silicon carbide or gallium nitride may also be used, as well as other insulating materials such as silicon nitride, sapphire and diamond. In embodiments at least one second zone is provided between two of the first zones, but preferably there is a plurality of such second zones.

Preferably the drift region comprises interdigitated first and second zones or fingers. In some embodiments the lengths of the fingers increase and/or the spacings between the fingers decrease towards the first region. In other embodiments a said second zone is tapered in an opposite direction to the first zone, narrowing towards the second region. In embodiments the first zones contact the first and second regions but the second zones need not contact the second region. Both the first and second zones are preferably substantially horizontal and preferably the first zones are substantially uniformly doped. Where the first zones taper they preferably taper in a width perpendicular to the lateral direction between the first and second region; preferably the second zones also taper in this width.

In the above described embodiments an effective linear grading of the drift region doping profile may be achieved, thus providing an improved device breakdown voltage, but with a simplified fabrication process. In particular the preferably linear grading of the drift region doping is achieved by varying the amount of uniformly doped silicon, in preferred embodiments by tapering a uniformly doped drift region in the device width direction, from a small value at one end for example a source, p-well end, to occupy substantially the entire width direction of the device at an opposite end of the drift region, for example at a drain, n-well end. In this way fabrication of embodiments of the device requires fewer mask and implant steps than, for example, the known device described above with reference to U.S. Pat. No. 6,023,090. The patterning of the drift region may be performed, for example, using the TRENCH mask in an X-Fab XI10 process (X-Fab, Erfurt, Germany) which also facilitates integration with a CMOS process.

The above described lateral semiconductor device may be used in a range of high voltage power devices such as a high voltage diode, thyristor, SCR rectifier, LDMOSFET (lateral double diffused metal oxide semiconductor field effect transistor), LIGBT (lateral insulated gate bipolar transistor), a bipolar transistor, or a JFET function field-effect transistor). Thus in embodiments the lateral semiconductor device comprises a lateral MOS device, and the first region comprises a body region of the device. The MOS device may then further comprise a third region of the second conductivity type adjacent the body region, and a control electrode (either metal or polysilicon) disposed over at least a portion of the body region, and preferably over a portion of the lateral drift region (to provide a field plate), and insulated from the body region and from the drift region, for example by oxide. Where the lateral MOS device comprises a lateral MOSFET, the second region may comprise a drain region of the MOSFET and the third region a source region of the MOSFET. Where the lateral MOS device comprises an LIGBT the device may further comprise a fourth region having the first conductivity type, disposed adjacent the third region. The skilled person will understand that heavily doped contact regions and electrode metalisation are normally also present in such devices.

In preferred embodiments the first conductivity type is p-type and the second conductivity type is n-type, but the skilled person will understand that a device of opposite polarity may be constructed by choosing n-type doping for the first conductivity type and p-type doping for the second conductivity type.

According to another aspect of the present invention there is provided a lateral semiconductor-on-insulator device comprising a semiconductor substrate bearing an insulated layer over which a lateral MOS device is formed, the lateral MOS device comprising first and second semiconductor regions of opposing conductivity types linked by a lateral drift semiconductor region, said drift region comprising a plurality of zones, undoped zones alternating with doped zones, said doped zones joining said first and second regions and having an overall area which reduces from one of said first and second regions to the other of said first and second regions, whereby said drift region has a varying charge in a lateral direction between said first and second regions.

In a further aspect the invention provides a silicon-on-insulator lateral MOS device having a drift region comprising a plurality of doped zones, said doped zones being interleaved with insulating zones.

Preferably, as described above, one or both of the doped zones and insulating zones are tapered in the device width direction.

The invention also provides a lateral semiconductor-on-insulator device comprising: a semiconductor substrate; an insulating layer on said semiconductor substrate; and a lateral semiconductor device on said insulator; said lateral semiconductor device having: a first region of a first conductivity type; a second region of a second conductivity type laterally spaced apart from said first region; and a drift region extending in a lateral direction between said first region and said second region; and wherein said drift region comprises at least one doped zone having said second conductivity type, said doped zone having a dimension which reduces towards said first region.

These and other aspects of the present invention will now be further described, by way of example only, with reference to the accompanying figures in which.

Figure 4A:
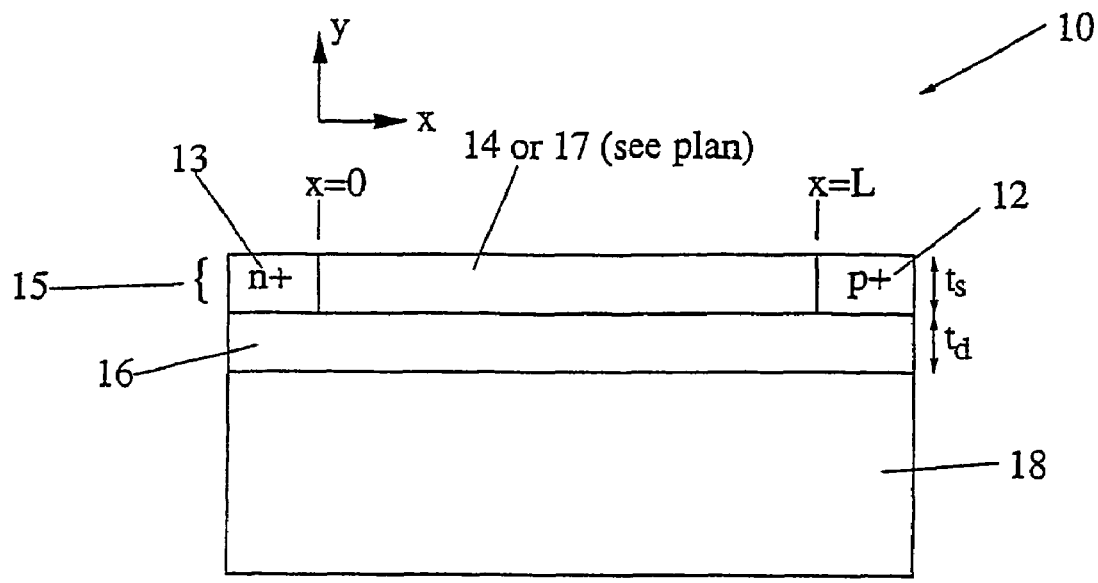
Figure 4B:
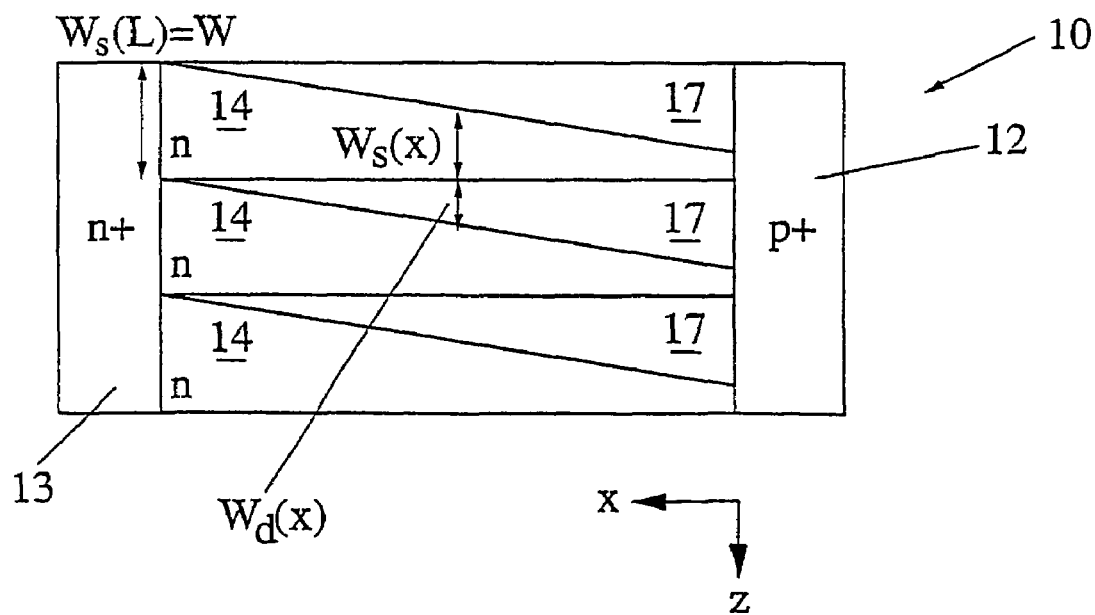
Figure 4C:
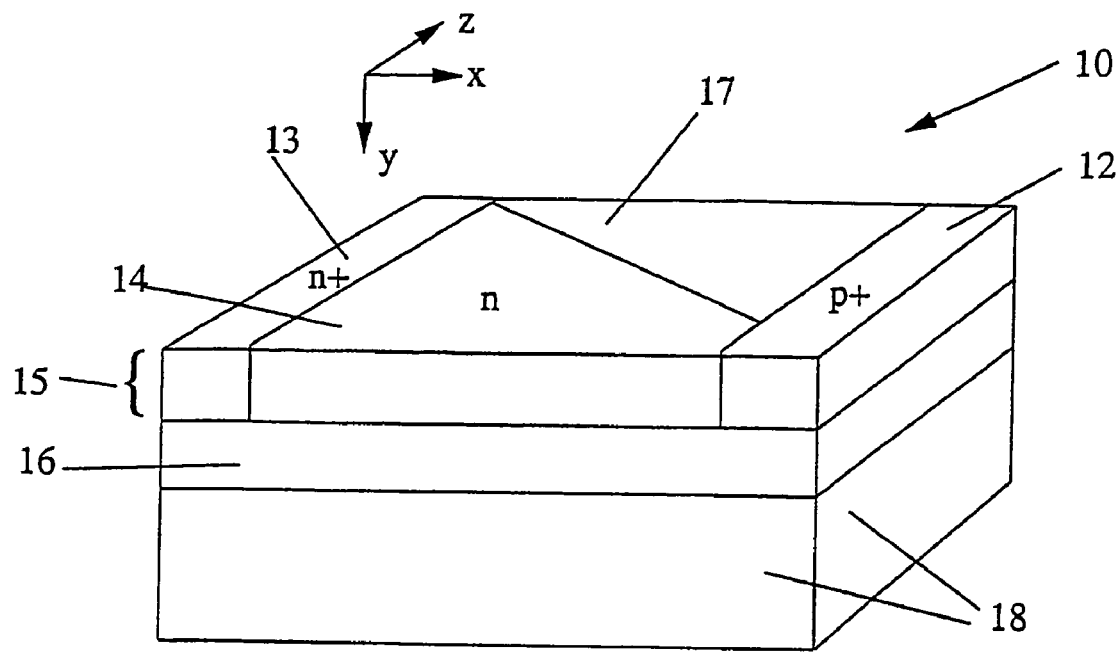
Figure 4D:
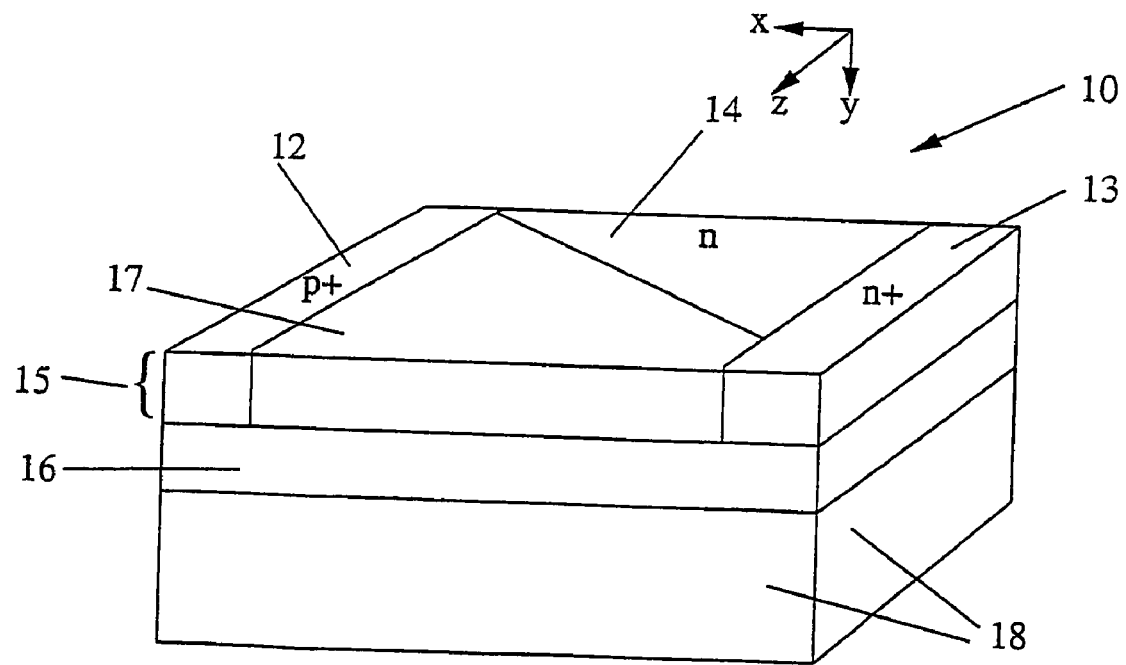
Figure 4E:
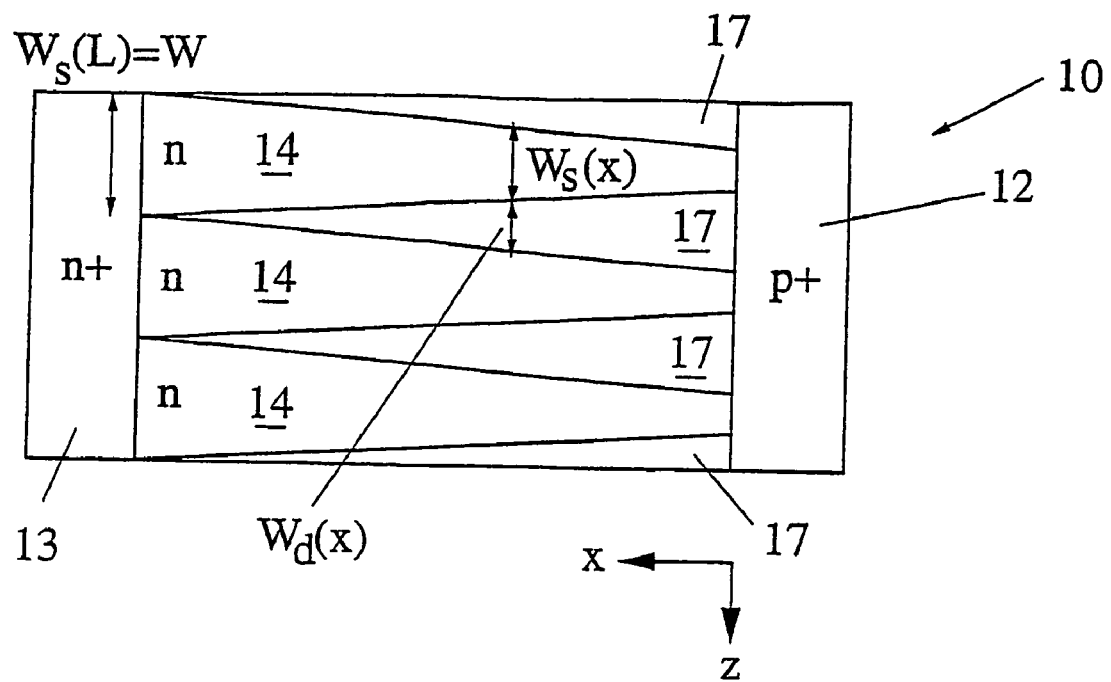
Figure 8:
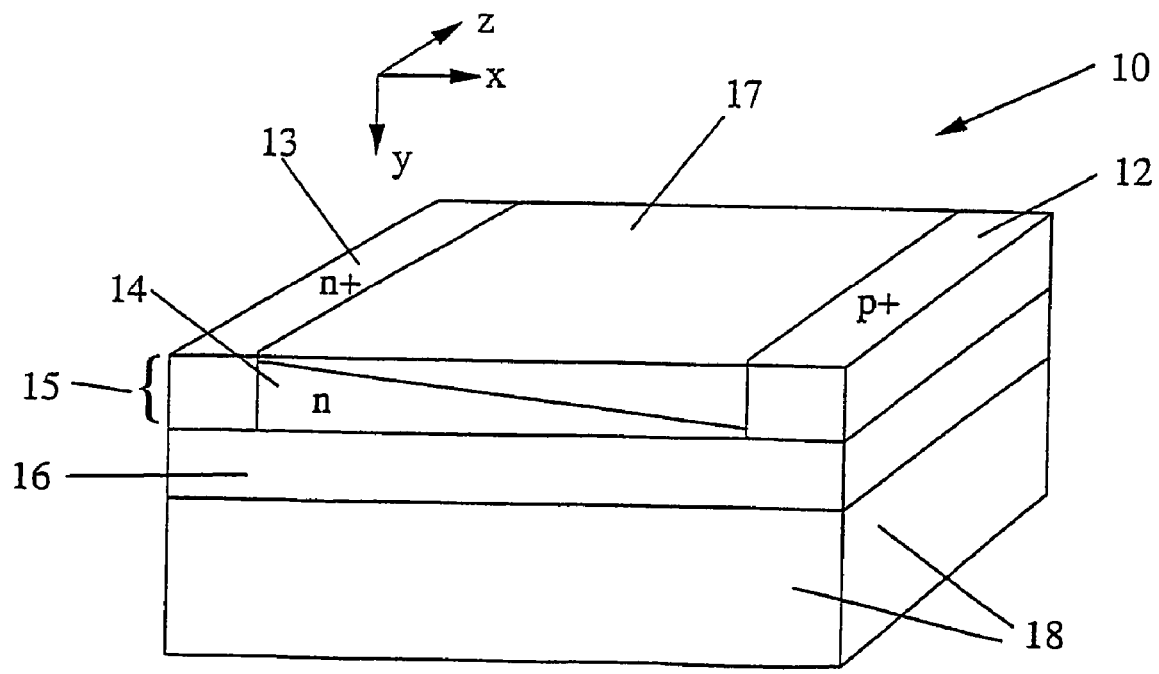
Figure 12:
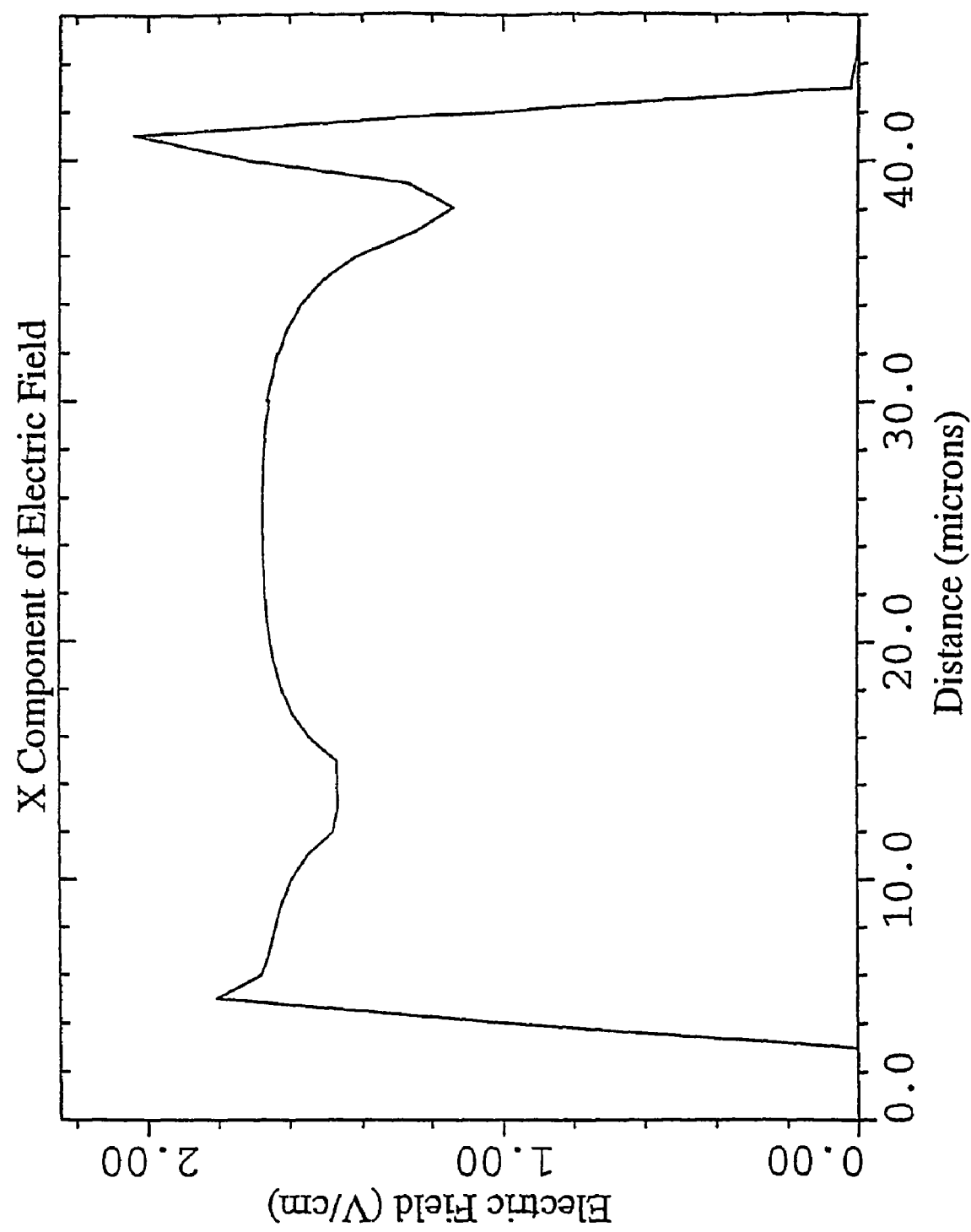
Figure 13:
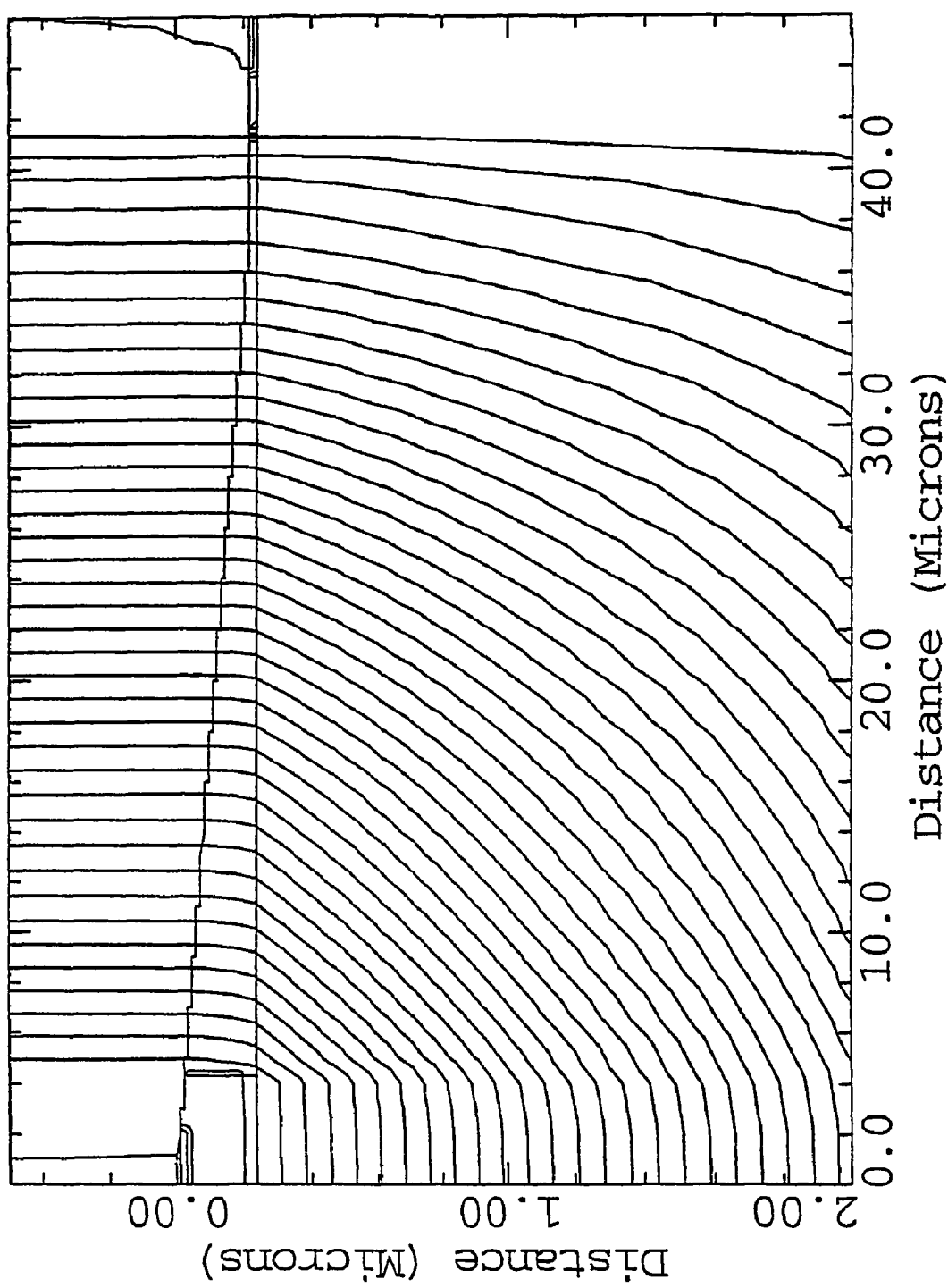
Figure 14:
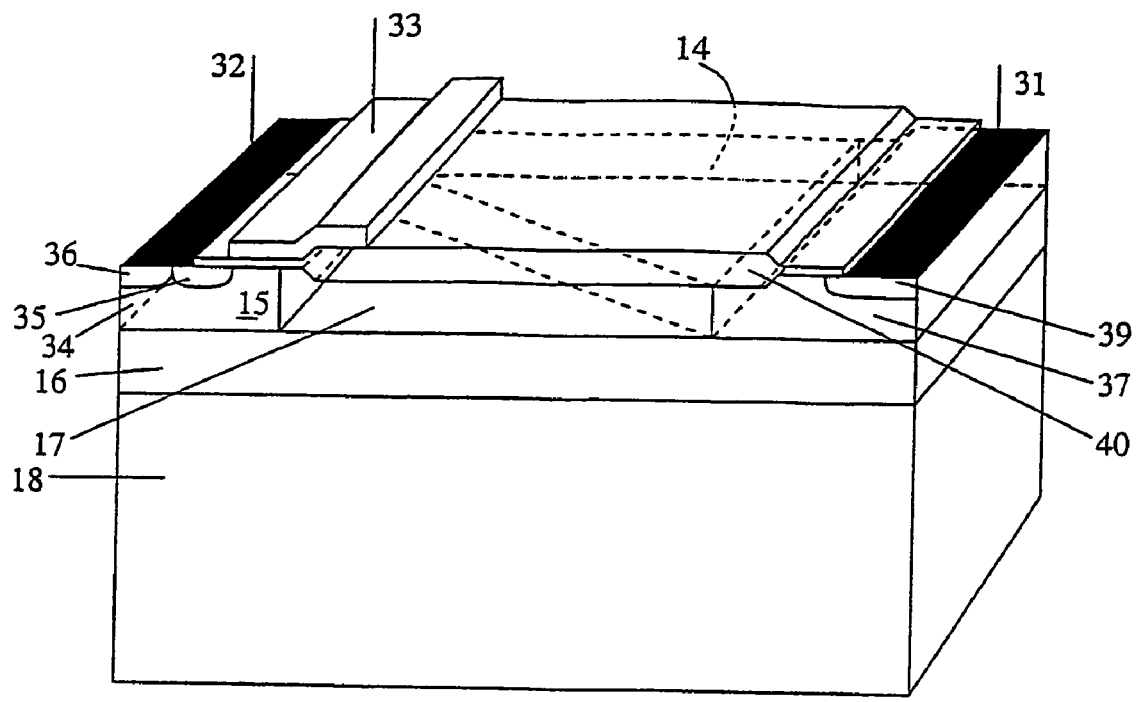
Figure 15:
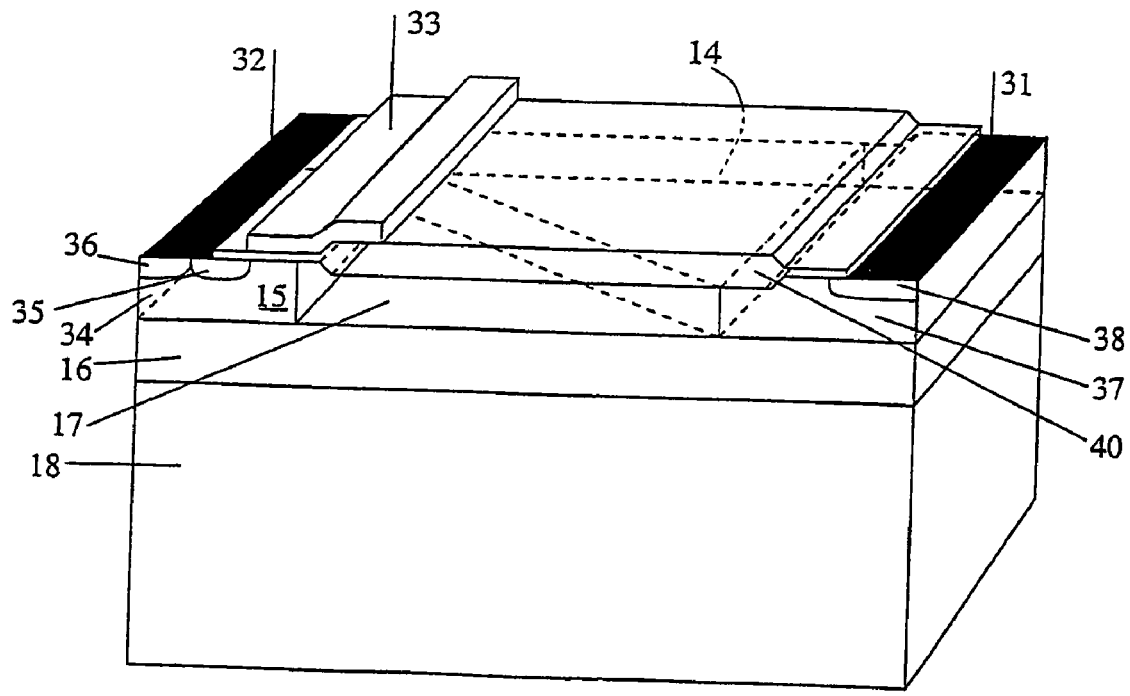
Figure 16:
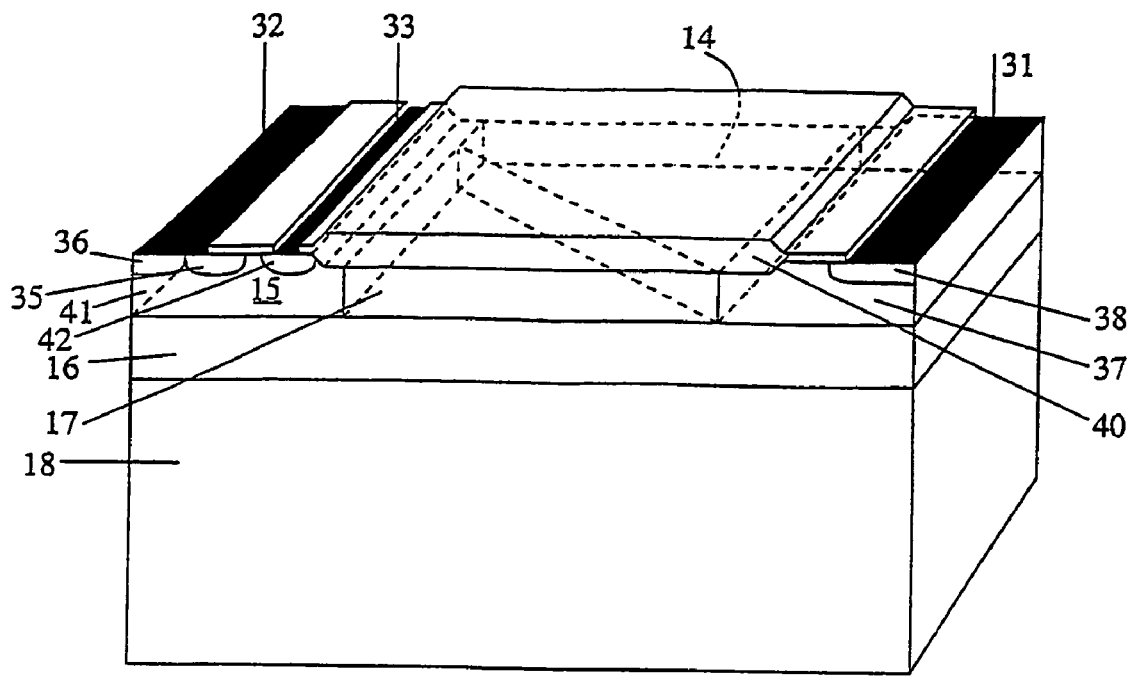
Figure 17:
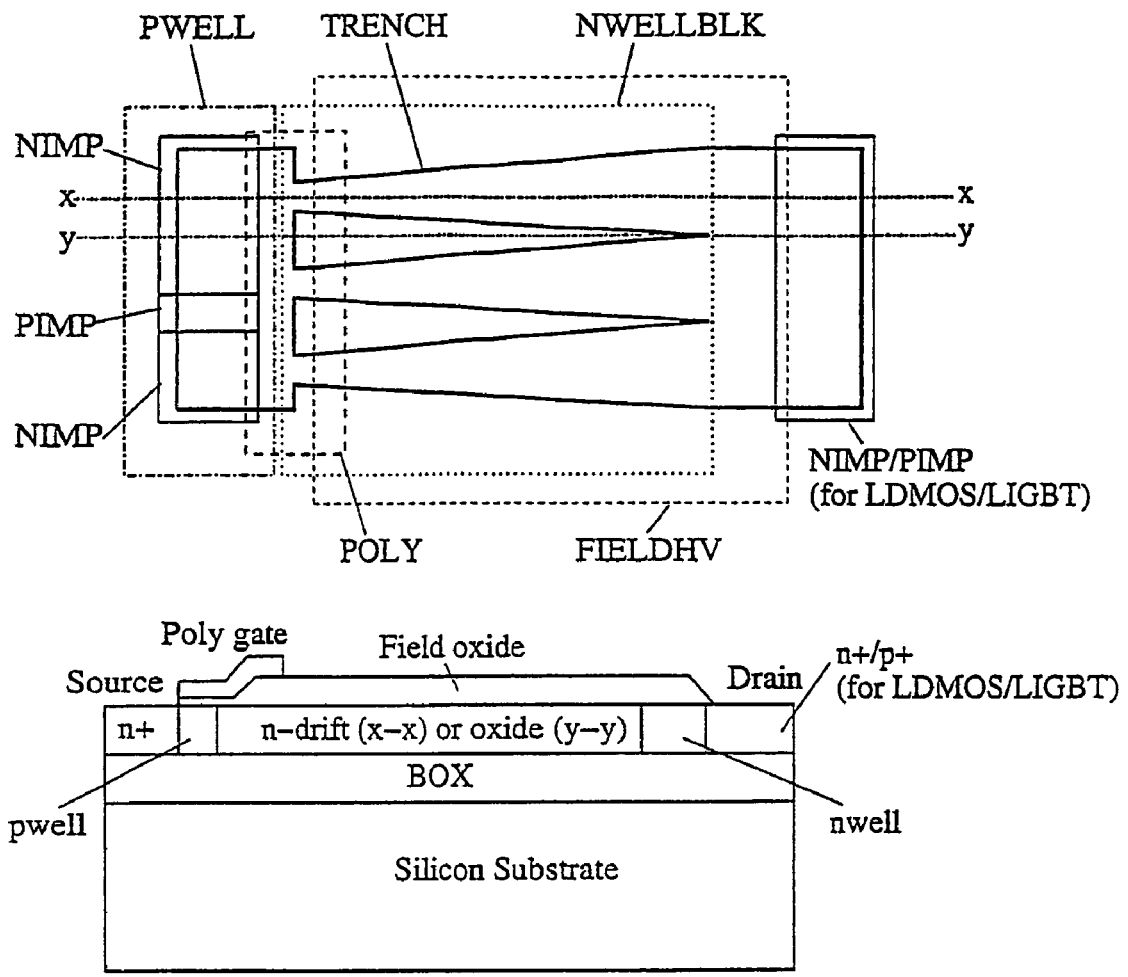

FIGS. 4a and 4b show, respectively, a vertical cross-section view and a plan view of a device according to an embodiment of the present invention; FIGS. 4(c) and 4(d) are perspective views of this embodiment, showing only one semiconducting sub-zone and one dielectric sub-zone of the drift region, and FIG. 4(e) shows an example of a modification to the device shown in FIG. 4(b) whereby the shape of the semiconducting sub-zone has been changed slightly to preserve device symmetry, FIGS. 5 to 11 show schematic perspective views of examples of diode structures according to alternative embodiments of the present invention;

FIG. 12 shows a graph of electric field against lateral position for a device as shown in FIG. 8;

FIG. 13 shows a plan view of a portion of a simplified device similar to that shown in FIG. 8 with a superimposed, simulated map of potential contours;

FIGS. 14 to 16 show schematic perspective views of further examples of devices according to embodiments of the present invention; and FIG. 17 shows a layout and resulting device cross-section of an implementation of the devices shown in FIGS. 14 and 15 using a commercially available silicon-on-insulator integrated circuit fabrication process.

Referring now to the drawings, FIGS. 4(a) and 4(b) show, respectively, a vertical cross-section and a plan view of a diode structure 10 according to a preferred embodiment of the present invention. FIGS. 4(c) and 4(d) show perspective views of this preferred embodiment. The diode 10 can be used as a two-terminal device but can also be part of a three terminal device, such as an LDMOSFET, LIGBT, bipolar transistor, SCR, thyristor, or LILET (lateral inversion layer emitter thyristor). In general, the major role of the diode (whether independent or as part of another high-voltage device) is to support the voltage while the device is in the off-state blocking mode (i.e., a reverse-bias is applied across its terminals) and to allow current conduction when a forward-bias is applied to its terminals. (When the diode forms part of a three terminal device, the purpose of the diode is to support the voltage while the device is in the off-state blocking mode; it is not usual in a three-terminal device for this diode to be forward-biased.) A p+ region 12 and an n+ region 13 are formed at opposed ends of the device 10 with a drift region 14 therebetween. The p+ region 12, n+ region 13 and drift region 14 are all formed in a semiconductor layer 15. The semiconductor layer 15 is commonly made of silicon or other known semiconductor and is itself formed on an insulating layer (i.e., a dielectric) 16. The insulating layer 16 is itself formed upon a semiconducting substrate 18. It is to be understood that the semiconducting substrate 18 can have a wide range of doping concentrations without affecting the operation of the device and in fact even a metallic conducting substrate would allow normal device operation. The drift region 14 in a practical application of the present invention can form the drift regions and channel regions of a MOS-controllable device, or other high-voltage device, as will be discussed further below.

The drift region 14 has a width, measured in the direction parallel to the edges of regions 12 and 13, which varies from a smaller value at the end of the drift region that adjoins region 12 to a larger value at the end of the drift region that adjoins region 13. The areas between this tapering drift region are filled with dielectric 17 which itself tapers in its width (also measured in the direction parallel to the edges of regions 12 and 13) from a smaller value at the end of the drift region which adjoins region 13 to a larger value at the end of the drift region which adjoins region 12. The combined widths of the drift region 14 and dielectric region 17 are such that, at any point along the drift length, the sum of those widths (measured in the direction parallel to the edges of regions 12 and 13, i.e., in the direction of the z-axis) remains constant in a preferred embodiment. However, it is to be understood that designs of lateral devices of this type often have regions of asymmetry where this rule may be broken and that these are contemplated within the present invention.

The purpose of varying the width of the drift region from a smaller value at the end of the drift region adjoining the p+ region 12 to the end of the drift region adjoining the n+ region 13, is that the total charge per unit total width of the device (i.e., the width including the drift region 14 and the dielectric region 17) will vary linearly along the device from region 12 to 13. This has the overall effect of providing a net linear increase in total dopant within the drift region of the device as we traverse from region 12 to 13, (cf U.S. Pat. No. 5,412,241).

Here we describe how such a linear increase in total dopant in the drift region can be obtained without the use of the additional photolithographic mask and implant step which the device described in U.S. Pat. No. 5,412,241 requires. As will be described in more detail below, many silicon-on-insulator CMOS processes offered by foundries such as XFAB in Erfurt, Germany, offer processes that are suitable for the fabrication of the present invention with few or no process modifications.

The way in which a linear increase in the total amount of n-type dopants contained within the drift region of the device as we traverse from the p+ region 12 to the n+ region 13 makes the lateral semiconductor device able to achieve high breakdown voltages in excess of 600V is well-known by persons skilled in the art of designing such silicon-on-insulator lateral high-voltage devices and is described in several patents (U.S. Pat. Nos. 6,232,636, 5,412,241 and 5,246,870) and in the published literature (e.g., Merchant et al, "Realization of High Breakdown Voltages (700V) in Thin SOI Devices", Proceedings $3^{rd}$ ISPSD, pp 31-35, 1991; A.K. Paul et al, "High Voltage LDMOS Transistors in Sub-Micron SOI Films", Proceedings $8^{th}$ ISPSD, pp 89-92, 1996; T. Letavic et al, "High Performance 600V Smart Power Technology Based on Thin Layer Silicon-on-Insulator", 1997 IEEE International SOI Conference, pp 49-52, 1997).

In the 1991 paper by Merchant, he derives the expression that gives the optimum linear doping profile for a given applied voltage V, a dielectric relative permittivity $K_d$, a semiconductor relative permittivity $K_s$, a dielectric layer thickness $t_d$, a semiconducting layer thickness $t_s$, and a drift length of L (refer to FIGS. 4(a) and 4(b) for definitions of these dimensions) as:

$$Q(x) = \frac{VK_s \varepsilon_0}{qL[(t_s/2) + t_d(K_s/K_d)]} x \qquad (1)$$

(1)

where x is the distance from the position in the drift region being considered to the p+ region of the device 12, Q(x) is the total dopant per unit area of the device in plan view, q is the electronic charge and $\varepsilon_0$ is the permittivity of free space.

By creating a device with such an optimum doping profile in the drift region, a uniform distribution of lateral electric field will be obtained. Such a distribution of lateral electric field ensures that there are no peaks in electric field at the two ends of the drift region adjoining p+ region 12 or n+ region 13 (as would otherwise be obtained in the prior art device of FIG. 1 were the drift region to be uniformly doped). By obtaining such a uniform distribution of lateral electric field, the maximum possible breakdown voltage achievable in such a lateral silicon-on-insulator diode may be obtained. This breakdown voltage is proportional to the drift length and as a general guide, for a device made from silicon with a drift length of 50 µm, breakdown voltages well in excess of 600V are readily obtainable.

The 1991 Merchant publication and later publications and patents by this and other authors teach that variation of dopant achieved through actual variation of the dopant density within the semiconductor layer 15 itself. Here a linear variation in dopant in the drift region is achieved by varying the ratio of the width of uniformly doped semiconductor drift region 14 ($W_s(x)$ in FIG. 4(b)) to the device width (W in FIG. 4(b)) from as small a ratio as is realistically possible at the end of the drift region adjacent to p+ region 12 to a ratio of 1 (i.e. width of dielectric 17 in FIG. 4(b), $W_d(L)$ is zero) at the end of the drift region which adjoins the n+ region 13. This has a corresponding overall effect in realising a linear grading of the drift region doping as we move from one end of the drift region to the other, resulting in the achievement of high breakdown voltages in excess of 600V.

To further clarify the design of the device, the linear increase in dopant per unit area given by Q(x) in equation (1) is achieved by varying $W_s(x)$ from a value that is close to zero (but clearly not zero as then the device would fail to conduct current when it is in its on-state—a range from 50 nm to 1 µm might be considered as realistic but other values may also be used) when x=0 to a value of several microns when x=L. However, the actual widths will depend on the thicknesses of the semiconductor layer 15 and dielectric layer 16, as well as on the applied voltage, the permittivities of the semiconductor and dielectric and on the drift length, as evidence by equation (1). Clearly, a wide range of device dopings and dimensions can be used to satisfy equation (1) and even if equation (1) is not exactly satisfied by the choice of dimensions and dopings, an increase in breakdown voltage over that that would be obtained with the prior art device shown in FIG. 1 can still be expected.

The diode will support the required high breakdown voltages if only one drift region 14 is placed alongside one dielectric region 17, as shown in the perspective views of FIGS. 4(c) and 4(d). However, it will be understood that often such lateral power devices have a large area to enable them to conduct large currents of the order of several mA and possibly up to 1A or more. In this instance, several drift regions 14 will be placed alongside one another, separated by several dielectric regions 17 as shown in the plan view of the preferred embodiment of the device in FIG. 4(b); in this figure three drift regions are placed alongside one another, each adjoined to one of three dielectric regions, but any number of such regions could be placed alongside one another. Sufficient regions will be placed alongside one another as shown to enable the required current to be able to be carried by the device when it is in its on-state. Such paralleling of the device will not normally affect its overall breakdown capability. Furthermore, although FIG. 4(b) shows the drift regions each having the same variation in width along the drift region length, there may be circumstances where it is desirable to have one or more of the drift regions having different variations in width along their length, as compared to other drift regions. As long as the overall ratio of total silicon width (i.e., summed over all the drift regions) to total device width varies approximately linearly along the drift region length, the net increase in dopant along the drift region length will be linear and the advantage of a high breakdown voltage will result.

In FIG. 4(e) is shown a plan view of a variation of the device shown in FIG. 4(b) where the variation of the width of the drift region 14 and of the dielectric 17 along the drift length is the same as in FIG. 4(b), but where the edges of the drift region 14 adjoining the dielectric region 17 are all subtend the same angle with the edges of the n+ region 13 and p+ region 12. This makes the device symmetric and therefore more easily drawn with computer-aided layout tools such as Cadence Virtuoso and Mentor Graphics IC Station. However, the breakdown voltage of the device is overall the same as for the device shown in FIG. 4(b).

As already discussed, a wide range of device dopings and dimensions will achieve the described advantages. An example of possible dimensions and drift region doping density that will achieve a breakdown voltage of 600V and which are manufacturable with known CMOS foundry processes are as follows: thickness of dielectric 16, $t_d=3$ µm; thickness of semiconductor layer 15, $t_s=0.25$ µm; uniform drift region doping density $=1.7 \times 10^{17}$ cm$^{-3}$; drift region length L=50 µm. For the example dimensions just given, the semiconductor material would be silicon and the dielectric material silicon dioxide. Clearly, other semiconductor materials would have different permittivities and would require different dimensions and/or dopings. For the example dimensions and drift region doping density given, the p+ region 12 and n+ region 13 can have a wide range of dopings without affecting the obtained breakdown voltage. The semiconductor substrate 18 can also have a wide range of doping densities without affecting breakdown voltage. Furthermore, the width of the drift region 14 at x=0, $W_s(0)$, although it should be as small as possible, can vary from 0.05 to 0.3 µm and the width of the drift region at x=L, $W_s(L)$, can vary from 0.5 to 5 µm. To reiterate, the width of the drift region 14, $W_s(x)$, must vary substantially linearly from its value at x=0 to its value at x=L. It should be understood that these dimensions are given by way of example only and are by no means exhaustive.

Figure 1:
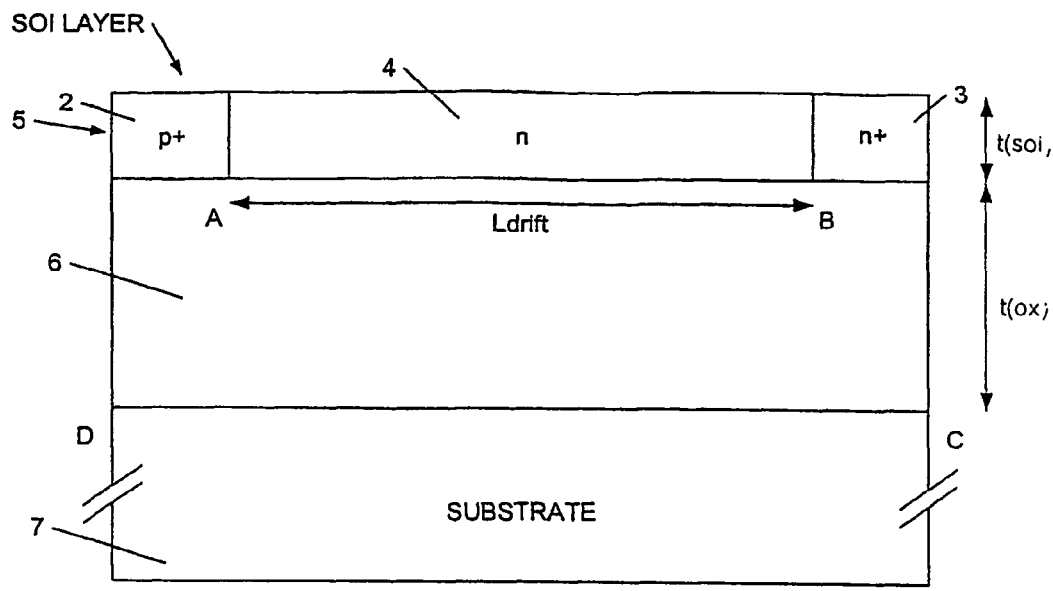
FIG. 1 shows a schematic diagram of a known high voltage silicon-on-insulator diode structure.
Figure 2:
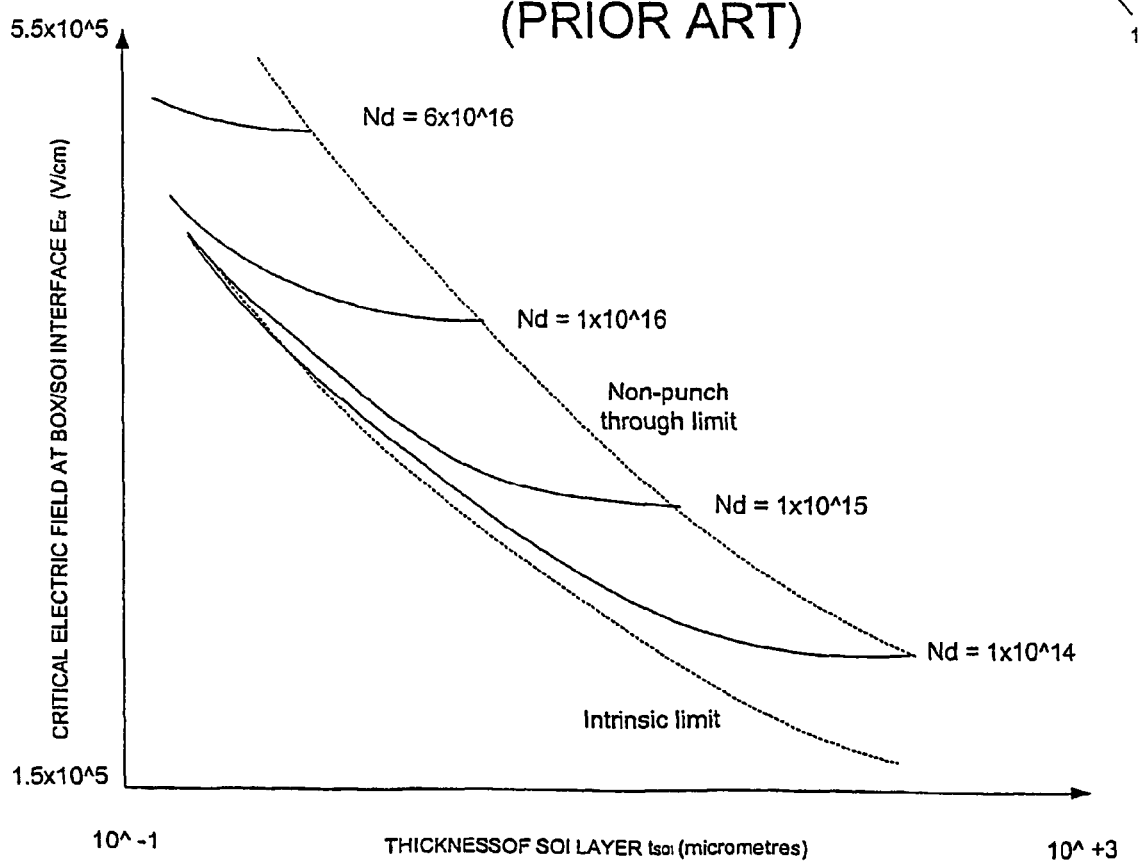
FIG. 2 shows a graph of the breakdown electric field of a silicon-on-insulator layer against layer thickness for a range of doping levels.
Figure 3A:
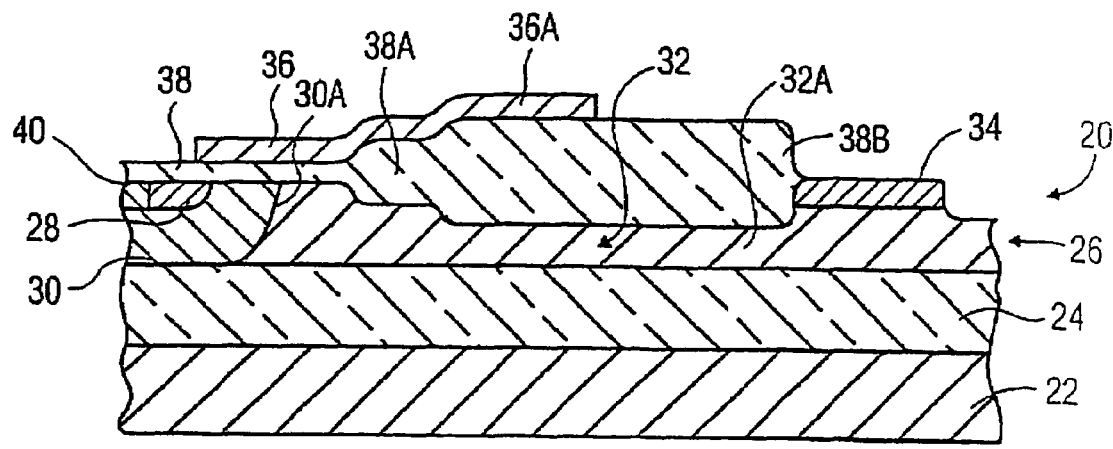
FIGS. 3a to 3c show, respectively, a vertical cross-section view through a known lateral thin film SOI device, and first and second plan views showing variants of this device.
Figure 3B:
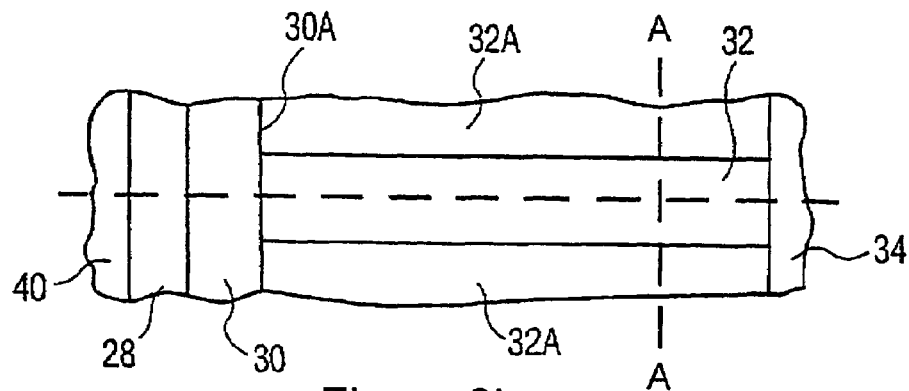
Figure 3C:
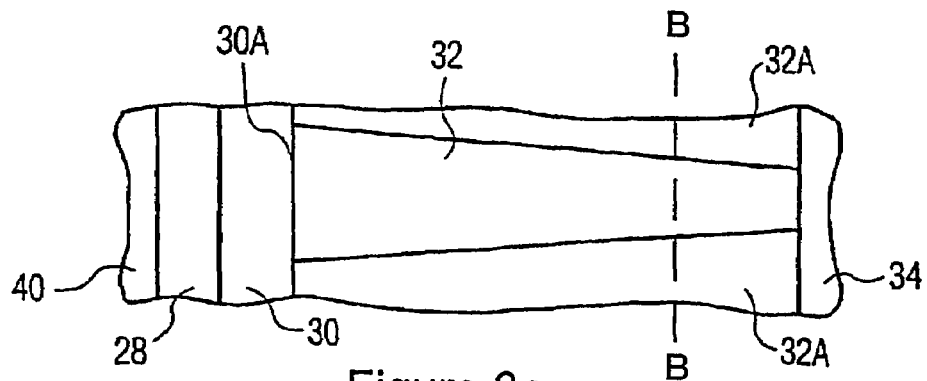
Figure 5:
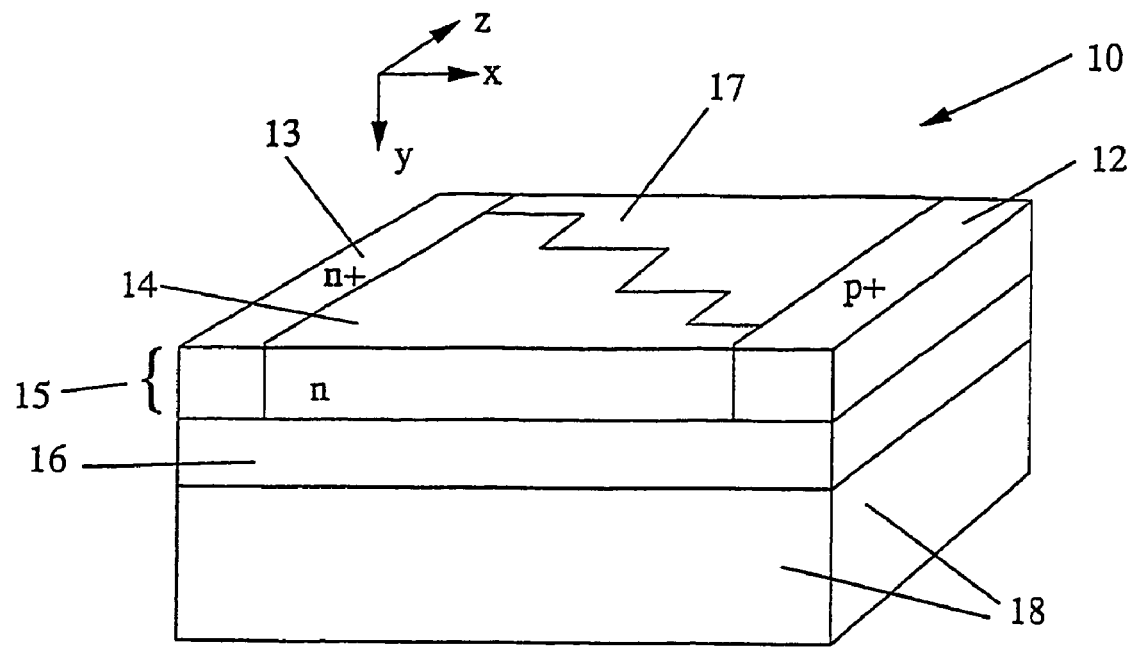

While the increase in the width of the drift region should increase linearly as described above to achieve the maximum possible breakdown voltage, enhancements over the breakdown voltage obtained with the prior art device of FIG. 1 will still be achieved with an increase in drift region width that is nonlinear but which varies substantially linearly from the end adjoining the p+ region 12 to the end adjoining the n+ region 13. Such a variation of the preferred embodiment of the device shown in FIG. 4 is shown in FIG. 5 whereby the interface between the drift region 14 and the dielectric region 17 has a non-linear geometrical shape (in the figure a step-like shape is shown). Such a device may be more easily created in semiconductor manufacturing processes that for some reason does not allow shapes which do not have orthogonal vertices. The variation of the width of the semiconductor layer 14 approximates the linear ideal, and the approximation can be made better the more, and more finely featured, steps are used.

Figure 6:
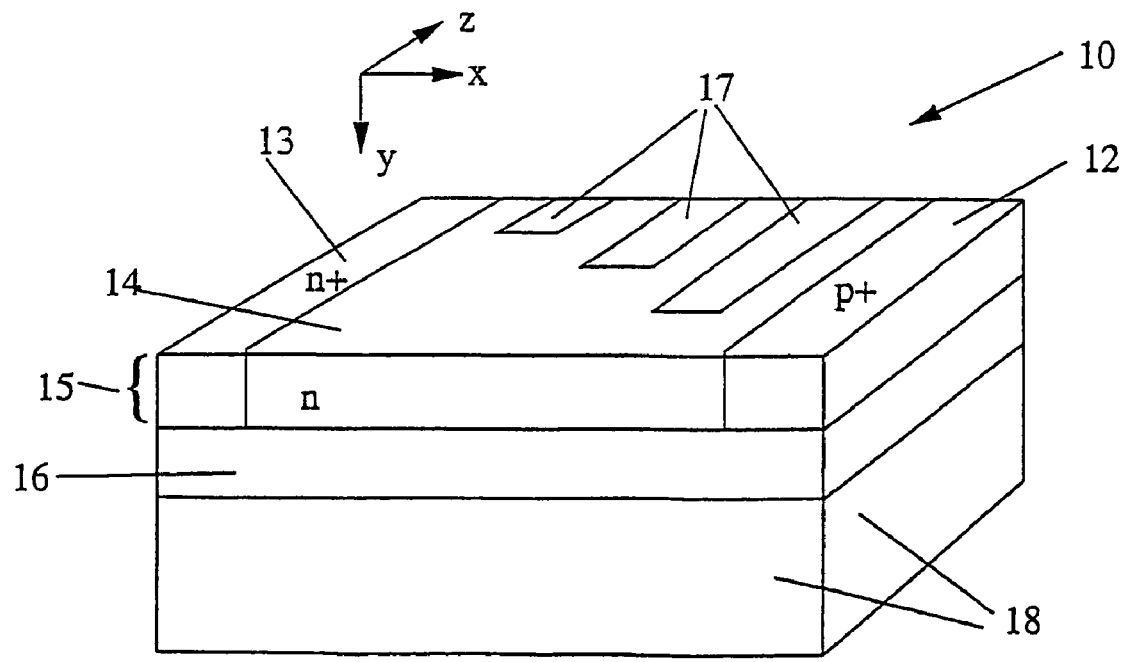

FIG. 6 shows another embodiment of this invention whereby the linear variation in the width of the drift region 14 is approximated by interspersing a continuous semiconductor layer 15 by isolated islands of dielectric 17. In such a way, the width of the drift region when averaged over a number of microns in its length (that number of microns being at least as large as the length of the dielectric islands 17) varies approximately linearly from the end of the drift region adjoining the p+ region 12 to the end of the drift region adjoining the n+ region 13. Such a structure may be more easily made in a manufacturing process that requires there to be a certain high percentage of silicon (as opposed to dielectric) covering the surface of the silicon chip.

Figure 7:
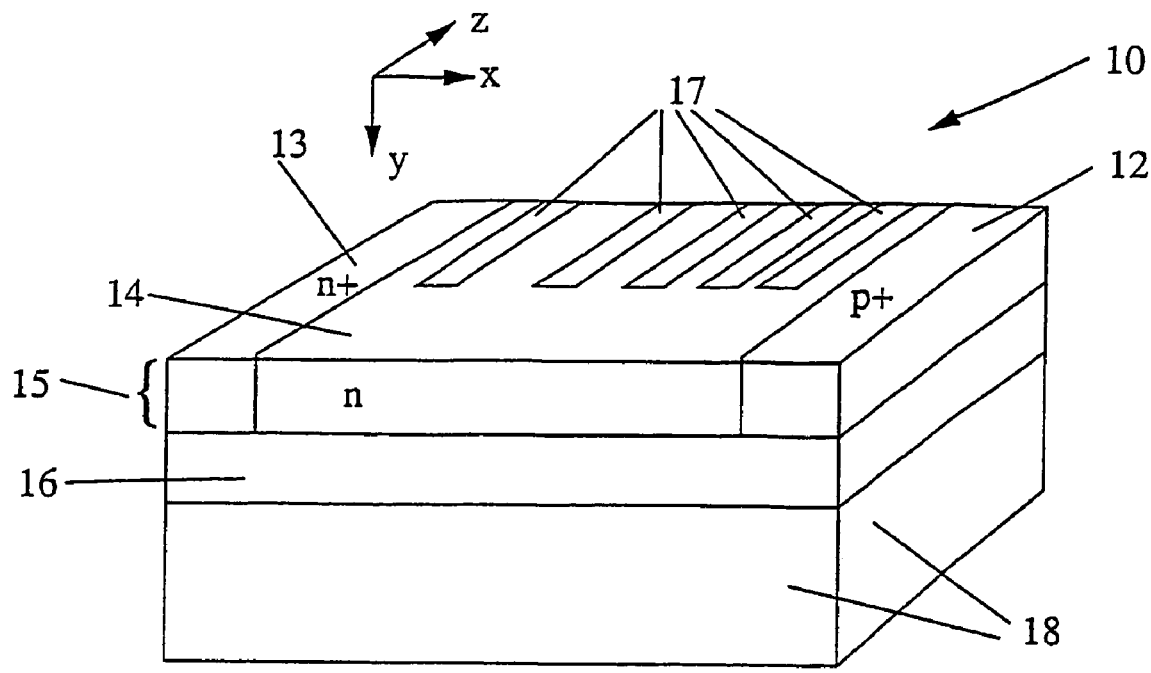

FIG. 7 shows a variation of the example shown in FIG. 6 whereby the average variation of the width of the drift region 14 is achieved by varying the spacing of similarly-sized dielectric region 14. The spacing is greater close to region 13 and becomes smaller and smaller towards region 12.

FIG. 8 shows another embodiment of the invention whereby the required linear variation of doping density is achieved by varying the thickness in the y-axis direction of the semiconductor layer 15 from which the drift region 14 is formed, from a smaller value at the end abutting region 12 to a larger value at the end abutting region 13. To maintain a total thickness of drift region 14 plus dielectric region 17 which is constant, the thickness of the dielectric region 17 is reduced from the end abutting region 12 to the end abutting region 13. For the avoidance of doubt, the drift region 14 is uniformly doped. The net effect of this thickness variation is exactly the same as the variation in drift region width shown in the first embodiment which was described above and is shown in FIG. 4, and the expected high breakdown voltage will be about the same.

Figure 9:
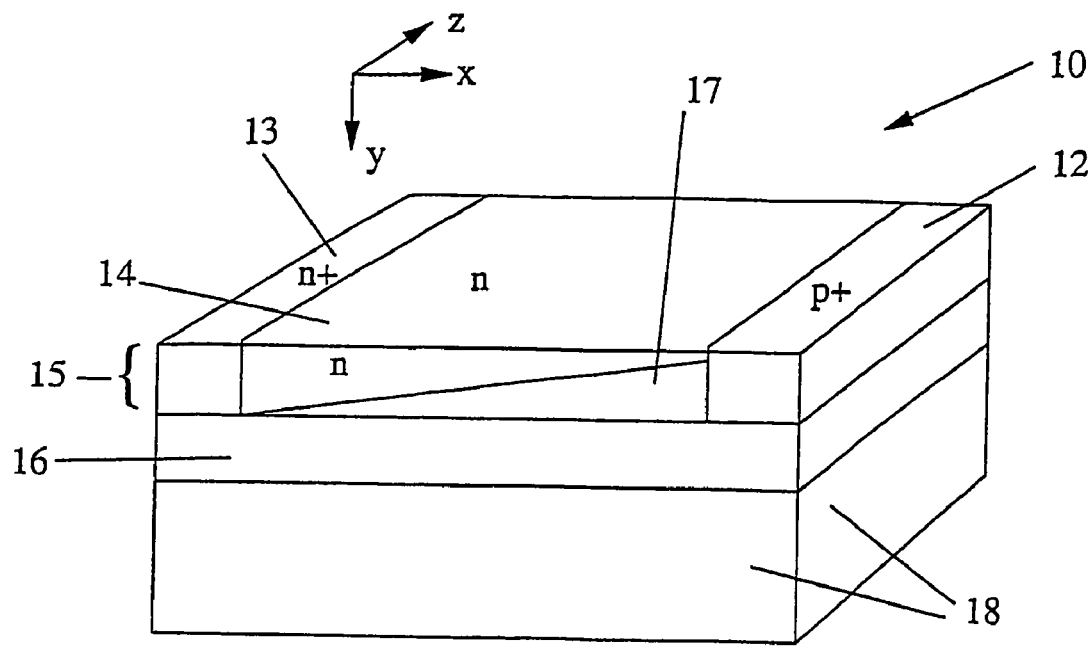

FIG. 9 shows a variation on the structure shown in FIG. 8 in which the upper surface of the drift region 14 is parallel to the dielectric layer 16 and it is the lower surface which is moved to obtain the substantially linear increase in drift layer thickness the end abutting region 12 to the end abutting region 13.

Figure 10:
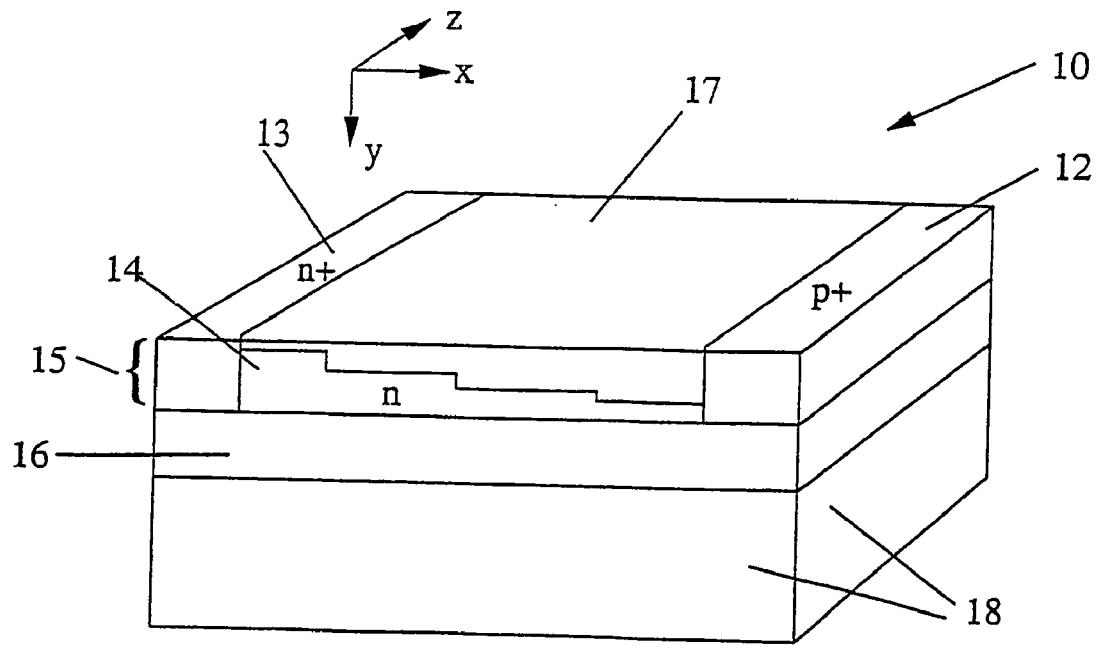

FIG. 10 is a variation on the structure shown in FIG. 8 in which the thickness is not varied linearly but has the step-like variation shown. It is expected that such a structure would be simpler to fabricated than the structure in FIG. 8 while still preserving the advantage of a higher breakdown voltage than the prior art device in FIG. 1.

Figure 11:
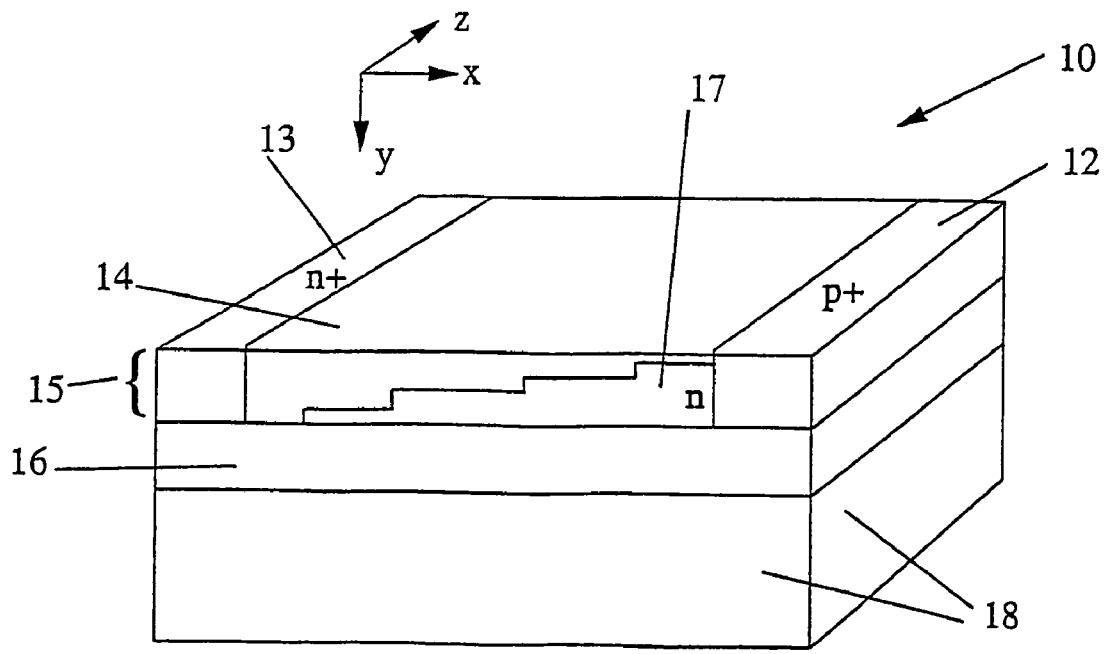

FIG. 11 is a variation of the structure shown in FIG. 9, analogous to the variation of FIG. 10 from the structure shown in FIG. 8.

FIGS. 12 and 13 respectively show the lateral electric field and the potential contours for a device of the type shown in FIG. 8 at breakdown, calculated using numerical simulations. In the simulations, the semiconductor layer 15 was made of silicon, the dielectrics 16, 17, and an additional dielectric layer placed on top of the device were all made of silicon dioxide. The drift layer thickness varied from 0.02 um at the end of the drift region abutting the p+ region 12 to 0.25 um at the end of the drift region abutting the p+ region. The drift length was 40 um and the uniform doping was $2 \times 10^{17}$ cm$^{-3}$. The p+ region 12 and the n+ region 13 were both doped to a level of $1 \times 10^{21}$ cm$^{-3}$. The device breakdown voltage, calculated using numerical simulation, was 604V. It can be seen from FIG. 12 how the lateral electric field is very uniform compared with a prior art device of this type; furthermore, FIG. 13 (in which the semiconductor substrate is not shown) shows how the potential contours are uniformly distributed throughout the drift region. It can also be seen that the vertical component of electric field at the surface of the drift region is close to zero, which is a feature of silicon-on-insulator devices with a graded drift region doping profile.

It will be understood that in the preceeding descriptions of devices in FIGS. 4-11, the positions of all the n and p type regions can be exchanged to give a device that will block a negative applied voltage. This will be apparent to those skilled in the art FIG. 14 shows schematically an example of an n-channel single gate LDMOSFET 30 according to embodiments of the present invention having trapezoidal prismatic drift region 14 and dielectric region 17. P-channel devices can be built by exchanging the positions of all the n and p type regions, as will be well understood.

In order to form an LDMOSFET, a MOSFET channel must be formed at the surface of the device. This can be accomplished by replacing part of the p+ region 12 of the device 10 in FIG. 4 with a p layer 34 just before the n drift region 14 as shown schematically in FIG. 14. The p layer 34 also acts as the p well where the usual MOSFET channel is formed. The usual n+ source 35 and the p+ short 36 at the source end and the n well 37 and n+ drain region 38 at the drain end are also provided. In the forward blocking state, the device behaves exactly as for devices shown in FIGS. 4-11 whereby a depletion region spreads throughout the entire drift region and stops at the n well 37 leaving a drift region which is entirely depleted of free carriers. As in the diodes of FIGS. 4-11, the lateral electric field in the drift region is substantially uniform, and the vertical electric field at the surface of the device is close to zero. Thus, a high breakdown voltage can be achieved in the MOSFET 30 of FIG. 14 in exactly the same way as it can be achieved in the diodes 10 of FIGS. 4-11.

In the on-state of the LDMOSFET 30, the p layer 34 can be inverted by applying a potential higher than the threshold voltage to the LDMOSFET Gate 33. Electrons will then flow from the source terminal 32, n+ source 35 through the channel formed in the p layer 34, n drift region 14 to the n well 37, through the n+ drain 38 and to the drain terminal 31.

It should be understood at this point that in semiconductor-on-dielectric high-voltage devices such as those described herein in which there is a semiconductor substrate 18 below a dielectric layer 16 of 0.1 to 5 um in thickness, that the total dopant contained within the drift region 14 tends to be significantly higher than an equivalent device made in a pure semiconductor substrate (known as bulk silicon and without the buried dielectric layer 16), for an optimum breakdown voltage. This is due to the field-plating effect of the semiconductor substrate. That is, when the device is blocking a high voltage, charge in the form of an accumulation or inversion layer, builds up on the surface of the semiconductor substrate 18 adjoining the dielectric layer 17. This negative charge (for an n-type drift region) is of a greater amount than the charge contained within the depletion region of an equivalent bulk silicon device and necessitates a higher positive charge in the n-type drift region to counterbalance it.

Hence, the total dopant must be higher in the n-drift region of a silicon-on-dielectric device than in a bulk silicon device, where both have a drift region doping optimised for the best breakdown voltage (also known as an optimum RESURF effect). This has important ramifications for these high-voltage devices in their usual circuit applications. Normally one would wish a high-voltage LDMOSFET to have a low on-resistance. Since the on-resistance is largely determined by the resistance of the drift region, the greater dopant level allows a lower on-resistance to be achieved in the semiconductor-on-dielectric LDMOSFET 30 of FIG. 14 than a comparable bulk silicon device.

LDMOSFETs such as that in FIG. 14 are commonly used in "source-high" mode where the load is connected to the source of the power device. In this circuit consideration the semiconductor substrate 18 is commonly several hundred volts lower in potential than the source 32, gate 33 and drain 31 of the device. In the prior art devices described in, for example, U.S. Pat. No. 5,412,241 where the drift region doping concentration is graded (rather than the amount of uniformly doped drift region silicon, there will usually be an area of particularly low doping concentration adjacent beneath the gate of the device. This can lead to a large increase in on-resistance when the device is used in source-high mode, caused by a depletion region extending vertically through the drift layer and pinching it off (i.e., there is formed a parasitic MOSFET between the semiconductor substrate, the buried dielectric layer, and the drift region, which turns off). An advantage of arrangements described herein is that, because the doping concentration of the drift region is uniform, the drift region can have a doping level such that the drift region is not pinched off when the device is operating in source-high mode, and a low on-resistance (similar in magnitude to the on-resistance in source-low mode) can be maintained.

FIG. 15 shows an example of a Lateral Insulated Gate Bipolar Transistor (LIGBT) according to the main embodiment of the present invention. In FIG. 15, the n+ drain of FIG. 14 has been replaced with a p+ anode injector 39. This is the only difference between LDMOSFETs and LIGBTs, although a person skilled in the art will realise that a combination of n+ and p+ drain regions can be used to make an "anode-shorted" LIGBT. The LIGBT is a bipolar device operating in high-level injection mode. When the gate 33 of the device is biased positively creating an inversion layer at the surface of the pwell 15, a MOS channel is formed linking the drift region 14 to the n+ source 35. This MOS channel causes an electron current to flow from the n+ source 35, through the inversion layer at the surface of the pwell 34, into the drift region 14, through the nwell 37 and into the p+ anode injector 39. This electron current forward-biases the p/n junction formed between region 39 and 37, and a large hole current flows into the drift region, causing the pnp transistor formed between p+ injector 39, nwell 38 and ndrift 14, pwell 34 and p+ source 36 to enter a high-level-injection regime, flooding the drift region with a high level of carriers (in excess of its doping concentration). The off-state operation of the device is similar to that of the LDMOSFET.

FIG. 16 shows an example of a Junction Field-Effect Transistor (JFET) according to the main embodiment of the present invention. In FIG. 16, the pwell 34 of FIG. 14 has been replaced with an nwell 41, the gate 33 of FIG. 15 has been removed, and a p+ region 41 has been introduced in the nwell and is electrically connected to the gate terminal 33. These are the only differences between LDMOSFETs and JFETs, although it is possible for the p+ region 41 to reach down to the top surface of the dielectric layer 16, in which case JFET gate action would have to be obtained by having separate p+ islands isolated from one another, with nwell lying in-between. With the gate connected to the source and a positive voltage applied to the drain, current will from from the source 32, through the n+ region 35, through the nwell 41 (through the gap between the p+ region 42 and dielectric 16), the ndrift region 14, the nwell 40 and the n+ drain 38 to the drain terminal 31. This current is controlled by the application of a negative bias to the gate terminal 33 which in turn causes a depletion region to spread from the p+ region 42 into the nwell 41, thus narrowing the region through which the current can flow and reducing its magnitude. Once the bias on the gate terminal 33 is sufficient for this depletion region to meet the top surface of the dielectric layer 16 "pinch-off" occurs and the channel in the nwell through which current was flowing is completely cut-off, stopping the current flow through the nwell 41 and hence from source to drain. In this "pinch-off" regime of operation, high positive voltages can be applied to the drain 31 and the device will block those voltages due to the depletion region spreading from the p+ region 42, through the nwell 41 and into the ndrift region 14. When the maximum drain voltage is applied, the potential is almost uniformly dropped across the drift region, as described above for the embodiment of the device shown in FIG. 4, to give a lateral electric field which is substantially uniform.

FIG. 17 gives a very specific example of how the devices of FIGS. 14 and 15 might be designed in a currently available semiconductor manufacturing process—the XI10 silicon-on-insulator process offered by XFAB Semiconductor Foundries, Erfurt, Germany, with the addition of one extra mask, NWELLBLK which blocks the highly-doped nwell implant. The layout of all the masking layers pertaining to the device itself are shown—to give the device terminals and electrical connectivity, extra layers available in the process such as CONTACT, MET1, VIA1, MET2, VIA2 and MET3 may be used, as will be apparent to a person skilled in the art of semiconductor device design. A cross-section is also shown of the device that will result from this mask layout. Contacts, vias and metal layers have also been omitted from the cross-section.

We have described a technique for achieving high breakdown voltages in devices fabricated in semiconductor on dielectric wafers having a semiconductor substrate, a buried dielectric layer, and a semiconductor surface layer. In preferred embodiments, the device has an n-type drift region of uniformly doped n-type semiconductor formed within the semiconductor surface layer. The semiconductor surface layer forming the drift region is tapered along the length of the drift region from a smaller width at the end abutting the p-type terminal to a larger width at the end abutting the n-type terminal. Several such regions may be placed alongside one-another to increase the current-carrying capability of the device, separated by dielectric zones tapered in the opposite sense. By this means, high breakdown voltages can be obtained.

Embodiments of the present invention have been described with particular reference to the examples illustrated. However, it will be appreciated that variations and modifications may be made to the examples described within the scope of the present invention. In particular, while in all described embodiments the doping of the drift region 14 has been assumed uniform, some non-uniform doping of the drift region, such as the addition of more highly-doped n-type or p-type islands, or a non-uniform doping profile, may also be used. Furthermore, while the interface between the drift region 14 and the dielectric region has been assumed to be a straight line or stepped in all of the examples, the junction may have another configuration, such as for example curved or flared or serpentine or some other irregular shape, and offer similar advantages to those described above. Additionally, one or more of the devices described can be combined by stacking them on top of each other, or by placing them together at some angle, including at right-angles to one another.

No doubt many other effective alternatives will occur to the skilled person. It will be understood that the invention is not limited to the described embodiments and encompasses modifications apparent to those skilled in the art lying within the spirit and scope of the claims appended hereto.

The invention claimed is:

1. A lateral semiconductor-on-insulator device comprising:
a semiconductor substrate;
an insulating layer on said semiconductor substrate; and
a lateral semiconductor device on said insulator;
said lateral semiconductor device having:
a first region of a first conductivity type;
a second region of a second conductivity type laterally spaced apart from said first region; and
a drift region extending in a lateral direction between said first region and said second region; and
wherein said drift region comprises at least one first zone and at least one second zone adjacent a said first zone, a said first zone having said second conductivity type, a said second zone being an insulating zone, a said first zone being tapered to narrow towards said first region.

2. A lateral semiconductor-on-insulator device as claimed in claim 1 wherein said drift region comprises interdigitated first and second zones.

3. A lateral semiconductor-on-insulator device as claimed in claim 1 wherein a said second zone is tapered to narrow towards said second region.

4. A lateral semiconductor-on-insulator device as claimed in claim 3 wherein said first and second zones are tapered in a width perpendicular to said lateral direction.

5. A lateral semiconductor-on-insulator device comprising:
a semiconductor substrate;
an insulating layer on said semiconductor substrate; and
a lateral semiconductor device on said insulator;
said lateral semiconductor device having:
a first region of a first conductivity type;
a second region of a second conductivity type laterally spaced apart from said first region; and
a drift region extending a lateral direction between said first and said second region; and
wherein said drift region comprises interdigitated first and second zones, said first zones having said second conductivity type, a said second zone being an insulating zone, and wherein a ration of a lateral area of said drift region occupied by a said first zone to a lateral area occupied by a said second zone is less towards said first region than towards said second region.

6. A lateral semiconductor-on-insulator device as claimed in claim 5 wherein each said second zone comprises a finger having a length extending perpendicular to said lateral direction.

7. A lateral semiconductor as claimed in claim 6 having a plurality of said fingers, lengths of said fingers increasing towards said first region.

8. A lateral semiconductor as claimed in claim 7 having a plurality of said fingers, spacings between said fingers reducing towards said first region.

9. A lateral semiconductor-on-insulator device as claimed in claim 1 wherein said first zones are substantially uniformly doped.

10. A lateral semiconductor-on-insulator device as claimed in claim 1 wherein said semiconductor comprises silicon, wherein said insulating layer comprises a buried oxide layer, and wherein a said second zone comprises an oxide zone.

11. A lateral semiconductor-on-insulator device as claimed in claim 1 wherein said semiconductor device comprises a MOS device, wherein said first region comprises
a body region of said MOS device,
said MOS device further comprising
a third region of said second conductivity type adjacent said body region, and a control electrode disposed over at least a portion of said body region and over a portion of said lateral drift region and insulated from said body region and from said drift region by an insulating region.

12. A lateral semiconductor-on-insulator device as claimed in claim 11 wherein said lateral MOS device comprises a lateral MOSFET, wherein said second region comprises a drain region of said MOSFET, wherein said third region comprises a source region of said MOSFET, and wherein said control electrode comprises a gate of said MOSFET.

13. A lateral semiconductor-on-insulator device as claimed in claim 11 wherein said lateral MOS device comprises a lateral insulated gate bipolar transistor (IGBT), said lateral IGBT further comprising a fourth region of said first conductivity type adjacent said third region.

14. A lateral semiconductor-on-insulator device as claimed in claim 1 wherein said lateral semiconductor device comprises a junction field effect transistor (JFET).

15. A lateral semiconductor-on-insulator device as claimed in claim 1 wherein said first conductivity type is p-type and said second conductivity type is n-type.

16. A lateral semiconductor-on-insulator device comprising
a semiconductor substrate bearing an insulated layer over which a lateral MOS device is formed, the later MOS device comprising
first and second semiconductor regions of opposing conductivity types linked by a lateral drift semiconductor region,
said drift region comprising
a plurality of zones, undoped zones alternating with doped zones, said doped zones joining said first and second regions and having an overall area which reduces from one of said first and second regions to the other of said first and second regions, whereby said drift region has a varying charge in a lateral direction between said first and second regions.

17. A lateral semiconductor-on-insulator device as claimed in claim 16 wherein said doped zones have a conductivity type matching that of said second region, and wherein said drift region charge reduces away from said second region.

18. A lateral semiconductor-on-insulator device as claimed in claim 16 wherein said undoped zones comprise oxide zones.

19. A lateral semiconductor-on-insulator device as claimed in claim 16 wherein said lateral MOS device comprises a lateral MOSFET.

20. A lateral semiconductor-on-insulator device as claimed in claim 16 wherein said lateral MOS device comprises a lateral IGBT.

21. A lateral semiconductor-on-insulator device as claimed in claim 16 wherein said lateral MOS device comprises a lateral JFET.

22. A lateral semiconductor-on-insulator device comprising:
a semiconductor substrate;
an insulating layer on said semiconductor substrate; and
a lateral semiconductor device on said insulator;
said lateral semiconductor device having:
a first region of a first conductivity type;
a second region of a second conductivity type laterally spaced apart from said first region; and
a drift region extending in a lateral direction between said first region and said second region; and
wherein said drift region comprises
at least one doped zone having said second conductivity type, said doped zone having a dimension which reduces towards said first region; and
at least one undoped zone.

23. A lateral semiconductor-on-insulator device as claimed in claim 22 wherein said doped zone has a width perpendicular to said lateral direction which reduces towards said first region.

24. A lateral semiconductor-on-insulator device as claimed in claim 22 wherein said undoped zone further comprises an insulating zone adjacent said doped zone.

25. A later semiconductor-on-insulator device as claimed in claim 22 wherein said undoped zone reduces in width towards said second region.

* * * * *